United States Patent
Yang

(10) Patent No.: US 9,396,776 B2
(45) Date of Patent: Jul. 19, 2016

(54) SEMICONDUCTOR DEVICE

(71) Applicant: SK Hynix Inc., Icheon-si Gyeonggi-do (KR)

(72) Inventor: Seung Yeub Yang, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/849,720

(22) Filed: Sep. 10, 2015

(65) Prior Publication Data

US 2016/0163365 A1 Jun. 9, 2016

(30) Foreign Application Priority Data

Dec. 9, 2014 (KR) .................. 10-2014-0175618

(51) Int. Cl.
| | | |
|---|---|---|
| *G11C 7/14* | (2006.01) | |
| *G11C 5/02* | (2006.01) | |
| *G11C 7/06* | (2006.01) | |

(52) U.S. Cl.
CPC .. *G11C 7/14* (2013.01); *G11C 5/02* (2013.01); *G11C 7/06* (2013.01); *G11C 7/065* (2013.01)

(58) Field of Classification Search
CPC ..................... H01L 2224/73265; G11C 7/065
USPC ................................................... 365/51, 205
See application file for complete search history.

(56) References Cited

U.S. PATENT DOCUMENTS

| | | | | |
|---|---|---|---|---|
| 6,639,822 B2* | 10/2003 | Fujisawa | ................ | G11C 5/025 257/E27.097 |
| 2003/0095429 A1* | 5/2003 | Hirose | ..................... | G11C 7/02 365/149 |
| 2004/0228176 A1* | 11/2004 | Fujisawa | ................ | G11C 5/025 365/158 |
| 2010/0014339 A1* | 1/2010 | Echigoya | ............... | G11C 5/025 365/51 |
| 2012/0218835 A1* | 8/2012 | Yun | ......................... | G11C 29/24 365/189.11 |
| 2013/0301370 A1* | 11/2013 | Narui | ..................... | G11C 7/227 365/210.1 |
| 2013/0343113 A1* | 12/2013 | Matsuda | ............ | G11C 11/1675 365/69 |

FOREIGN PATENT DOCUMENTS

| | | | |
|---|---|---|---|
| KR | 1020100036596 A | 4/2010 |
| KR | 1020140028949 A | 3/2014 |

\* cited by examiner

*Primary Examiner* — Michael Tran
(74) *Attorney, Agent, or Firm* — William Park & Associates Ltd.

(57) ABSTRACT

A semiconductor device may include a mat array, and a plurality of memory cell mats each including bit lines. The memory cell mats may be included in the mat array. The semiconductor device may include edge sense amplifier blocks comprising edge sense amplifiers coupled to half of the bit lines of the outermost memory cell mats among the memory cell mats. The half of the bit lines of the outermost memory cell mats may be coupled to the edge sense amplifiers, respectively, and may be configured for a first input. The semiconductor device may include half dummy mats each having an area corresponding to half of the area of a memory cell mat of the plurality of memory cell mats and configured to provide reference bit lines for a second input to the edge sense amplifiers, respectively.

17 Claims, 6 Drawing Sheets

SEMICONDUCTOR DEVICE

CROSS-REFERENCES TO RELATED APPLICATION

The present application claims priority under 35 U.S.C. §119(a) to Korean Patent Application No. 10-2014-0175618, filed on Dec. 9, 2014, in the Korean Intellectual Property Office, which is incorporated herein by reference in its entirety.

BACKGROUND

1. Technical Field

Various embodiments generally relate to a semiconductor device and more particularly, to a design technology for a semiconductor device.

2. Related Art

Recently, various attempts have been made to develop a technology for increasing a net die in order to improve the fabrication costs associated with semiconductor memory devices. As one of the various attempts, a technology for modifying the $8F^2$ cell array structure into the $6F^2$ or $4F^2$ cell array structure has been suggested. Since the $6F^2$ cell array structure includes a larger number of cells integrated per unit area than the $8F^2$ cell array, much attention has been directed at the $6F^2$ cell array structure.

In general, a folded bit line scheme is applied to the $8F^2$ cell array structure, and an open bit line scheme is applied to the $6F^2$ cell array structure. The folded bit line scheme refers to a scheme in which a bit line and a bit line bar are formed in parallel to each other along one direction of a sense amplifier. The open bit line scheme refers to a scheme in which a bit line and a bit line bar are spaced from each other at both sides of a sense amplifier.

FIG. 1 is a diagram illustrating a semiconductor device with the open bit line scheme.

Referring to FIG. 1, a cell array CA within a memory cell mat includes a plurality of memory cells MC formed at the respective intersections between a plurality of word lines WL0 to WLn and a bit line pair BL0 and BLB1. The bit line pair BL0 and BLB1 formed in the cell array CA may be coupled to different sense amplifiers positioned at the top and bottom of the cell array CA.

Specifically, among the bit lines BL0 and BLB1, the first bit line BL0 is connected to a sense amplifier SA0 positioned at the top of the cell array CA. The sense amplifier SA0 amplifies the voltage of the memory cell MC through charge sharing with the bit line pair, that is, the first bit line BL0 and the first bit line bar BLB0. The first bit line bar BLB0 is coupled from a cell array within another memory cell mat.

Furthermore, among the bit lines BL0 and BLB1, the second bit line bar BLB1 is coupled to a sense amplifier SA1 positioned at the bottom of the cell array CA. The sense amplifier SA1 amplifies the voltage of the memory cell MC through charge sharing with the bit line pair, that is, the second bit line BL1 and the second bit line bar BLB1. The second bit line BL1 is coupled from a cell array within another memory cell mat.

FIG. 2 is a diagram illustrating the arrangement structure of a conventional memory bank with the open bit line scheme.

Referring to FIG. 2, a plurality of memory cell mats MAT0 to MAT15 are arranged in the memory bank, and sense amplifier blocks S/A_ARRAY0 to S/A_ARRAY15 are arranged between the respective memory cell mats MAT0 to MAT15. In FIG. 2, SA represents a sense amplifier included in the sense amplifier blocks S/A_ARRAY0 to S/A_ARRAY15. FIG. 2 also illustrates bit line pre-charge voltages VBLP.

In the open bit line scheme, the sense amplifier blocks positioned at the top and bottom of each memory cell mat are used in order to sense amplifier data stored in the memory cell mat.

In order for the first sense amplifier block S/A_ARRAY0 to sense and amplify data stored in a part of memory cells within the first memory cell mat MAT0 positioned at one edge of the memory bank, a dummy mat DUM_MAT is formed in the memory bank. That is, the first sense amplifier block S/A_ARRAY0 amplifies data stored in a part of memory cells within the first memory cell mat MAT0 through charge sharing with a bit line pair coupled from the dummy mat DUM_MAT and the first memory cell mat MAT0. The second sense amplifier S/A_ARRAY1 senses and amplifies data of the other memory cells within the first memory cell mat MAT0.

In the 16th memory cell mat MAT15 positioned at the other edge of the memory bank, only data stored in a part of memory cells within the 16th memory cell mat MAT15 are sensed and amplified by the 16th sense amplifier block S/A_ARRAY15, and data stored in the other memory cells within the 16th memory cell mat MAT15 are not sensed and amplified. The reason why no sense amplifier block is arranged at the bottom of the 16th memory cell mat MAT15 is that a bit line pair required for charge sharing is not provided for the corresponding sense amplifier block.

Thus, data which must be stored in the other memory cells of the 16th memory cell mat MAT15 are stored in the above-described dummy mat DUM_MAT, and then sensed and amplified by the first sense amplifier block S/A_ARRAY0. That is, the first sense amplifier block S/A_ARRAY0 amplifies the data stored in the other memory cells within the 16th memory cell mat MAT15 through charge sharing with the bit line pair coupled from the dummy mat DUM_MAT and the first memory cell mat MAT0. For this operation, the same word line address is allocated to the 16th memory cell mat MAT15 and the dummy mat DUM_MAT, and the 16th memory cell mat MAT15 and the dummy mat DUM_MAT are operated at the same time. Therefore, when the 16th memory cell mat MAT15 and the dummy mat DUM_MAT are operated, current consumption is doubled, compared to when another memory cell mat is operated.

SUMMARY

In an embodiment, a semiconductor device may be provided. The semiconductor device may include a mat array and a plurality of memory cell mats each including bit lines. The memory cell mats may be included in the mat array. The semiconductor device may include edge sense amplifier blocks comprising edge sense amplifiers coupled to half of the bit lines of the outermost memory cell mats among the memory cell mats. The half of the bit lines of the outermost memory cell mats may be coupled to the edge sense amplifiers, respectively, and may be configured for a first input. The semiconductor device may include half dummy mats each having an area corresponding to half of the area of a memory cell mat of the plurality of memory cell mats and configured to provide reference bit lines for a second input to the edge sense amplifiers, respectively. Each of the reference bit lines may be configured by coupling bit lines within the half dummy mat by two.

DETAILED DESCRIPTION

Hereinafter, a semiconductor device will be described below with reference to the accompanying drawings through various examples of embodiments.

Figure 1:
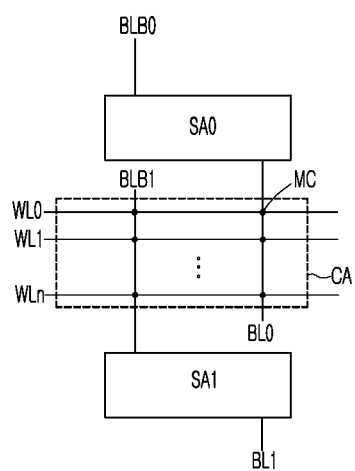
FIG. 1 is a diagram illustrating a general semiconductor device with an open bit line scheme.
Figure 2:
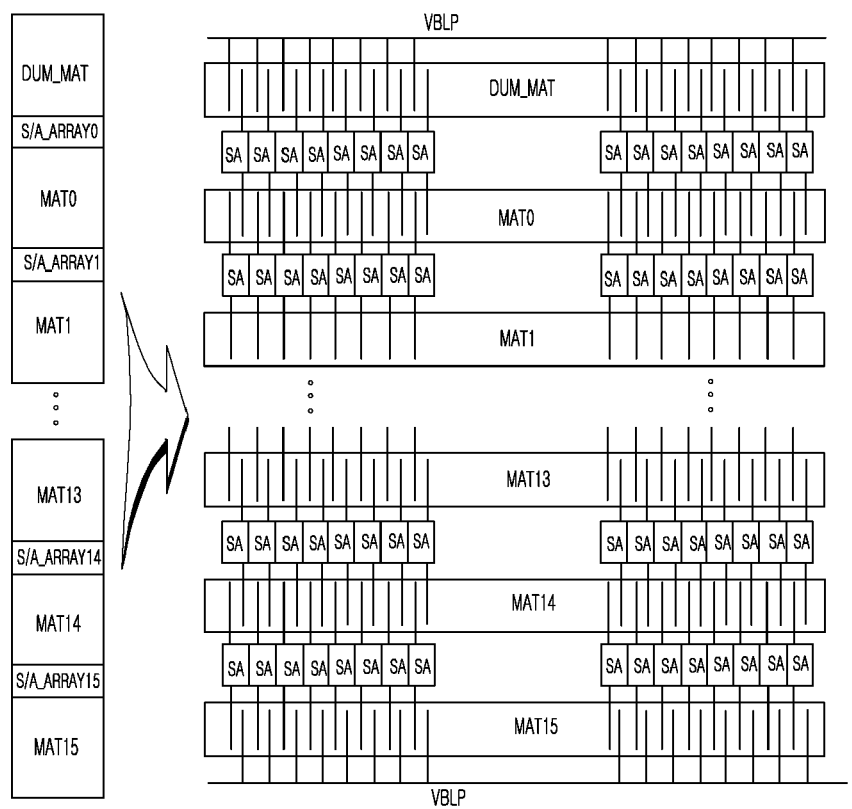
FIG. 2 is a diagram illustrating the arrangement structure of a conventional memory bank with the open bit line scheme.
Figure 3:
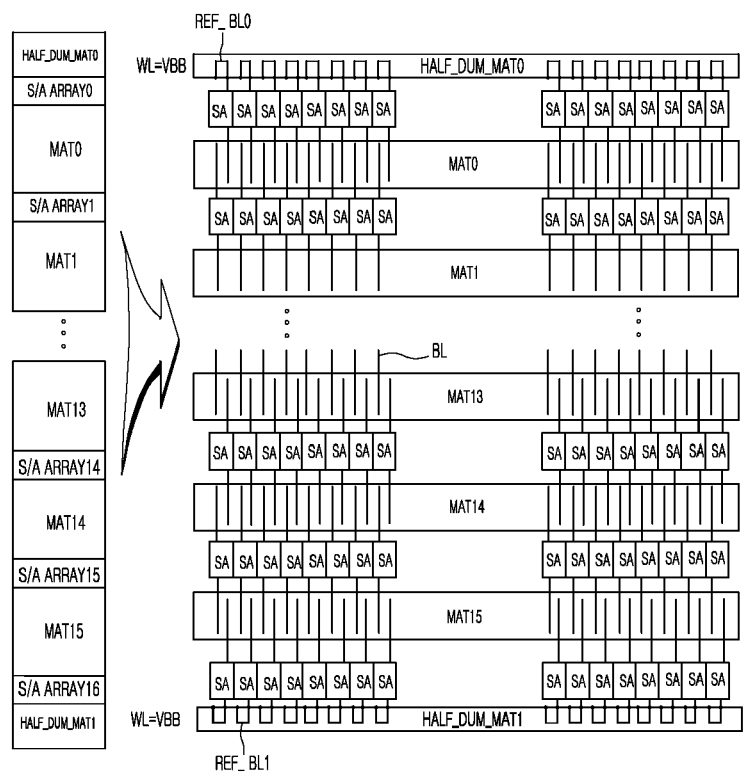
FIG. 3 is a diagram illustrating a representation of an example of an arrangement structure of a memory bank included in a semiconductor device in accordance with an embodiment.

FIG. 3 is a diagram illustrating a representation of an example of an arrangement structure of a memory bank included in a semiconductor device in accordance with an embodiment.

Referring to FIG. 3, the semiconductor device in accordance with an embodiment may include a plurality of memory cell mats MAT0 to MAT15, a plurality of sense amplifier blocks S/A_ARRAY0 to S/A_ARRAY16, and two half dummy mats HALF_DUM_MAT0 and HALF_DUM_MAT1. FIG. 3 illustrates an example in which 16 memory cell mats are included in one memory bank. However, the number of memory cell mats included in one memory bank may be greater or less.

Although not illustrated, each of the memory cell mats MAT0 to MAT15 may include DRAM cells arranged at the respective intersections between bit lines BL and word lines (not illustrated). Each of the DRAM cells may include, for example but not limited to, one transistor and one capacitor.

The sense amplifier blocks S/A_ARRAY0 to S/A_ARRAY16 may be arranged among the first half dummy mat HALF_DUM_MAT0, the first to 16th memory cell mats MAT0 to MAT15, and the second half dummy mat HALF_DUM_MAT1. The semiconductor device in accordance with an embodiment may have an open bit line scheme, and may use the sense amplifier blocks positioned at the top and bottom of each memory cell mat, in order to sense and amplify data stored in the memory cell mats MAT0 to MAT15.

The half dummy mats HALF_DUM_MAT0 and HALF_DUM_MAT1 may be arranged at the top and bottom of the memory cell mats MAT0 to MAT15, and each of the half dummy mats HALF_DUM_MAT0 and HALF_DUM_MAT1 may have an area corresponding to a half of the area of a single memory cell mat. The memory cell mats MAT0 to MAT15 may be located between the half dummy mats HALF_DUM_MAT0 and HALF_DUM_MAT1.

Hereafter, for convenience of description, the half dummy mat HALF_DUM_MAT0 positioned at the top of the memory cell mats MAT0 to MAT15 may be defined as the first half dummy mat, and the half dummy mat HALF_DUM_MAT1 positioned at the bottom of the memory cell mats MAT0 to MAT15 may be defined as the second half dummy mat.

Each of the first and second half dummy mats HALF_DUM_MAT0 and HALF_DUM_MAT1 may include a plurality of DRAM cells arranged at the respective intersections between word lines and bit lines, like the memory cell mats MAT0 to MAT15. Each of the DRAM cells may include one transistor and one capacitor.

Since each of the first and second half dummy mats HALF_DUM_MAT0 and HALF_DUM_MAT1 has an area corresponding to a half of the area of a single memory cell mat, each of the bit lines formed in the first and second half dummy mats HALF_DUM_MAT0 and HALF_DUM_MAT1 has a length corresponding to a half of the length of the bit lines formed in the memory cell mats MAT0 to MAT15. As the length of the bit lines is reduced to the half, the number of word lines formed in each of the first and second half dummy mats HALF_DUM_MAT0 and HALF_DUM_MAT1 may correspond to a half of the number of word lines formed in each of the memory cell mats MAT0 to MAT15.

Among the bit lines formed in the first and second half dummy mats HALF_DUM_MAT0 and HALF_DUM_MAT1, adjacent bit lines may be coupled by two to form reference bit lines REF_BL0 and REF_BL1. The reference bit lines REF_BL0 of the first half dummy mat HALF_DUM_MAT0 may be coupled to the first sense amplifier block S/A_ARRAY0, and the reference bit lines REF_BL1 of the second half dummy mat HALF_DUM_MAT1 may be coupled to the 17th sense amplifier block S/A_ARRAY16.

The first half dummy mat HALF_DUM_MAT0 may be provided to set a reference voltage level, when the first sense amplifier block S/A_ARRAY0 senses a part of data stored in the first memory cell mat MAT0. The first sense amplifier block S/A_ARRAY0 may amplify data stored in a part of memory cells within the first memory cell mat MAT0 through charge sharing with a half of the bit lines within the first memory cell mat MAT0 and the reference bit lines REF_BL0 of the first half dummy mat HALF_DUM_MAT0. The second sense amplifier S/A_ARRAY1 positioned at the bottom of the first memory cell mat MAT0 may sense and amplify data of the other memory cells within the first memory cell mat MAT0.

Since the first half dummy mat HALF_DUM_MAT0 only serves to set the reference voltage level when the first sense amplifier block S/A_ARRAY0 senses the data stored in the first memory cell mat MAT0, the memory cells within the first half dummy mat HALF_DUM_MAT0 may not be substantially used for data storage. When a high voltage is applied to word lines coupled to the unused memory cells, unnecessary current consumption may occur. Thus, in order to prevent unnecessary current consumption, a substrate bias voltage VBB may be continuously applied to all word lines within the first half dummy mat HALF_DUM_MAT0.

Like the first half dummy mat HALF_DUM_MAT0, the second half dummy mat HALF_DUM_MAT1 may be provided to set a reference voltage level, when the 17th sense amplifier block S/A_ARRAY16 senses a part of data stored in the 16th memory cell mat MAT15. The 17th sense amplifier block S/A_ARRAY16 may amplify data stored in a part of memory cells within the 16th memory cell mat MAT15 through charge sharing with a half of the bit lines within the 16th memory cell mat MAT15 and the reference bit line REF_BL1 of the second half dummy mat HALF_DUM_MAT1. The 16th sense amplifier S/A_ARRAY15 positioned at the top of the 16th memory cell mat MAT15 may sense and amplify data of the other memory cells within the 16th memory cell mat MAT15.

Since the second half dummy mat HALF_DUM_MAT1 only serves to set the reference voltage level when the 17th sense amplifier block S/A_ARRAY16 senses the data stored in the 16th memory cell mat MAT15, the memory cells within the second half dummy mat HALF_DUM_MAT1 may not be substantially used for data storage. In order to prevent unnecessary current consumption occurring when a high voltage is applied to word lines coupled to the unused memory cells, the substrate bias voltage VBB may be continuously applied to all word lines within the second half dummy mat HALF_DUM_MAT1.

When a bit line and a bit line bar have different capacitance values, noise may occur during a bit line precharge operation, thereby hindering the sensing operations of the sense amplifier block S/A_ARRAY0 to S/A_ARRAY16.

The bit lines formed in the first and second half dummy mats HALF_DUM_MAT0 and HALF_DUM_MAT1 may have a length corresponding to a half of the length of the bit lines BL formed in the first and 16th memory cell mats MAT0 and MAT15. However, the length of the reference bit lines REF_BL0 and REF_BL1 coupled to the first and 17th sense amplifier blocks S/A_ARRAY0 and S/A_ARRAY16 may be two times longer than the length of the bit lines formed in the first and second half dummy mats HALF_DUM_MAT0 and HALF_DUM_MAT1. Thus, the reference bit lines REF_BL0 and REF_BL1 may have substantially the same length as the bit lines BL formed in the first and 16th memory cell mats MAT0 and MAT15. Since each of the reference bit lines REF_BL0 and REF_BL1 is configured by coupling two adjacent bit lines and the interval between the adjacent bit lines is much less than the length of the bit lines, the length of lines coupled between the respective bit lines may be disregarded.

Thus, the bit lines of the first and 16th memory cell mats MAT0 and MAT15 and the reference bit lines REF_BL0 and REF_BL1 of the first and second half dummy mats HALF_DUM_MAT0 and HALF_DUM_MAT1 may have substantially the same capacitance value. Therefore, during the precharge operation of the first and 17th sense amplifier blocks S/A_ARRAY0 and S/A_ARRAY16, the occurrence of noise may be suppressed.

Figure 4:
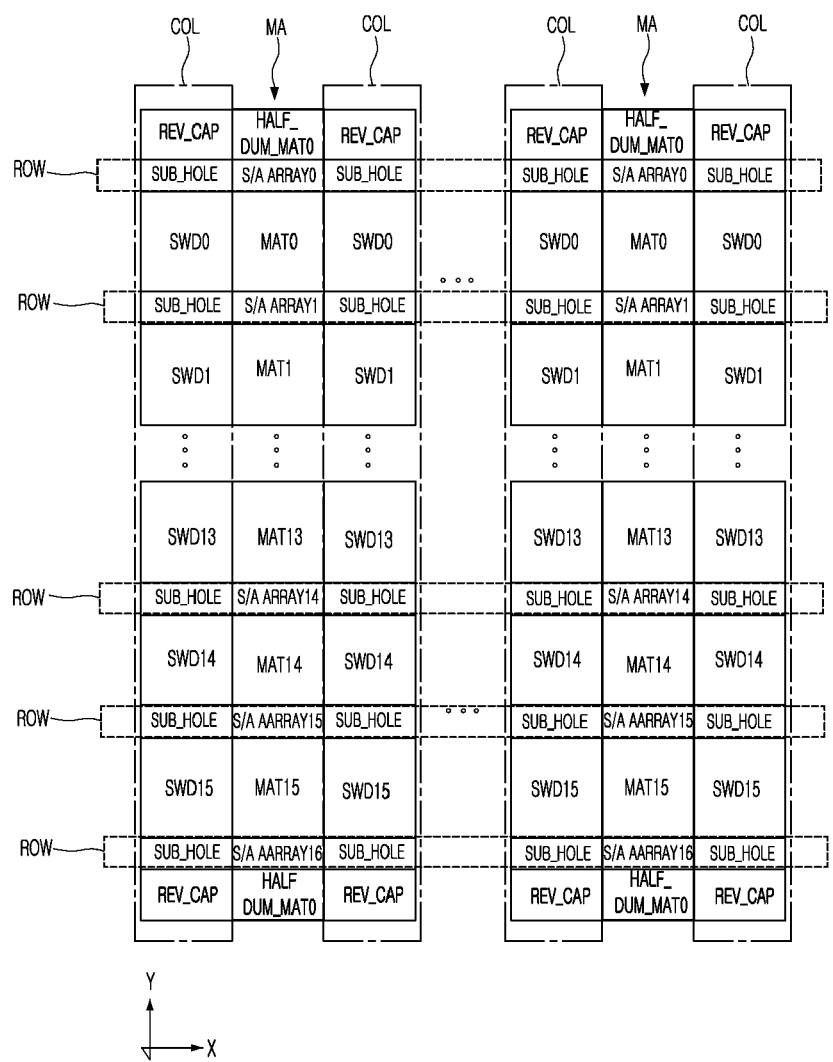
FIG. 4 is a diagram illustrating a representation of an example of the arrangement structure of sub-word line driver blocks in the semiconductor device in accordance with an embodiment.

FIG. 4 is a diagram illustrating a representation of an example of the arrangement structure of sub-word line driver blocks in the semiconductor device in accordance with an embodiment.

Referring to FIG. 4, a plurality of mat array MA may be arranged along a row (word line) direction, that is, a direction X defined in FIG. 4. Each of the mat arrays MA may include a first half dummy mat HALF_DUM_MAT0, a plurality of memory cell mats MAT0 to MAT15, and a second half dummy mat HALF_DUM_MAT1, which are arranged in a line along a column direction, that is, a direction Y defined in FIG. 4.

In each mat array MA, for example, there may be edge sense amplifier blocks located at the edges of a mat array MA. For example, sense amplifier block S/A_ARRAY0 may be located between the first half dummy mat HALF_DUM_MAT0 and the memory cell mat MAT0, and may be considered an edge sense amplifier block located at an edge of the mat array MA. For example, sense amplifier block S/A_ARRAY16 may be located between the second half dummy mat HALF_DUM_MAT1 and the memory cell mat MAT15, and may be considered an edge sense amplifier block located at an edge of the mat array MA. The edge sense amplifier blocks may include edge sense amplifiers coupled to a half of the bit lines of the outermost memory cell mats (i.e., MAT0 and MAT15), respectively, among the memory cell mats MAT0 to MAT15. The half of the bit lines of the outermost memory cell mats (i.e., MAT0 and MAT15) may be provided to the edge sense amplifiers of the edge sense amplifier blocks (i.e., S/A_ARRAY0 and S/A_ARRAY16) and may be configured for a first input.

Between the respective mat arrays MA, a column region Col may be arranged. Among the first half dummy mat HALF_DUM_MAT0, the plurality of memory cell mats MAT0 to MAT15, and the second half dummy mat HALF_DUM_MAT1, row regions Row may be arranged. Sub-hole regions SUB_HOLE may be arranged at the respective intersections between the column regions Col and the row regions Row.

In the column region Col at either side of the memory cell mats MAT0 to MAT15, sub word line driver blocks SWD0 to SWD15 may be arranged. The sub word line driver blocks SWD0 to SWD15 may include sub word line drivers to drive the word lines of the memory cell mats MAT0 to MAT15. Each of the row regions Row may include sense amplifier blocks S/A_ARRAY0 to S/A_ARRAY16 including sense amplifiers to sense the bit line voltages of the memory cell mats MAT0 to MAT15. In each of the sub-hole regions SUB_HOLE, a local input/output driver and a sense amplifier driver for driving a sense amplifier may be arranged.

In an embodiment, since the memory cells of the first and second half dummy mats HALF_DUM_MAT0 and HALF_DUM_MAT1 are not used, sub word line driver blocks for driving the word lines of the first and second half dummy mats HALF_DUM_MAT0 and HALF_DUM_MAT1 are not needed. Thus, an available space may be formed in the column regions Col at both sides of the first and second half dummy mats HALF_DUM_MAT0 and HALF_DUM_MAT1.

In the available spaces, that is, the column regions Col at both sides of the first and second half dummy mats HALF_DUM_MAT0 and HALF_DUM_MAT, a reservoir capacitor block REV_CAP including one or more reservoir capacitors may be arranged. The reservoir capacitor may supply a momentary current required during a high-speed operation of the semiconductor device, and prevent a rapid current flow into an internal circuit from an external power supply, thereby suppressing a voltage drop and noise induced by a power supply line. The reservoir capacitor may include a MOS-type capacitor having large capacitance in a small area.

In accordance with an embodiment, the amount of current consumed during the operation of the outermost memory cell mat can be reduced to the half, thereby contributing to low power consumption of the semiconductor device. Furthermore, the reservoir capacitors may be arranged in the column regions at both sides of the half dummy mat, thereby improving the stability of power supply.

Figure 5:
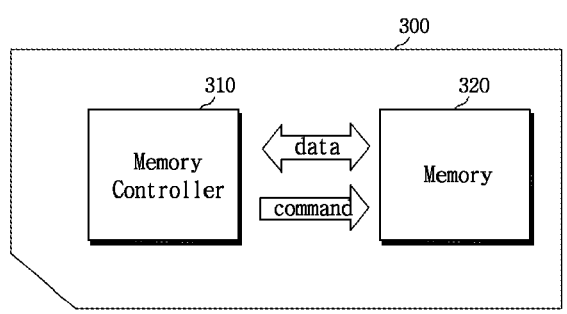
FIG. 5 is a schematic view illustrating a representation of an example of a memory card.

FIG. 5 is a schematic view illustrating a representation of an example of a memory card.

Referring to FIG. 5, the memory card 300 may include a memory controller 310 and a memory 320. The memory controller 310 and the memory 320 may exchange electrical signals. For example, according to a command of the memory controller 310, the memory 320 and the memory controller 310 may exchange data. The memory card 300 may store data in the memory 320 or output data to the outside from the memory 320. The memory 320 may include the above-described semiconductor devices (i.e., see FIGS. 3-4, and the related descriptions of FIGS. 3-4). The memory card 300 may be used as data storage media of various portable devices. For example, the memory card 300 may include a memory stick card, a smart media card (SM), a secure digital card (SD), a mini-secure digital card (SD), or a multi-media card (MMC).

Figure 6:
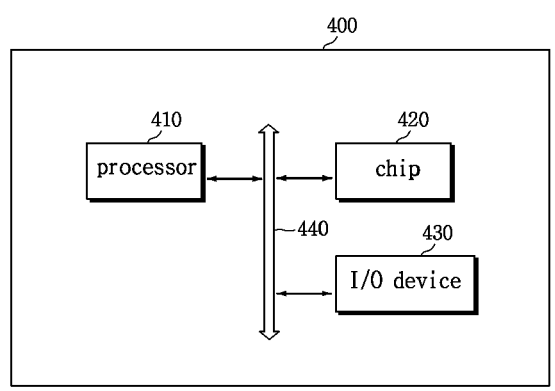
FIG. 6 is a block diagram illustrating a representation of an example of an electronic system.

FIG. 6 is a block diagram illustrating a representation of an example of an electronic system.

Referring to FIG. 6, the electronic system 400 may include a processor 410, an I/O device 430, and a chip 420. The processor 410, the I/O device 430, and the chip 420 may perform data communication with each other through a bus 440. The processor 410 may perform a program operation, and control the electronic system 400. The I/O device 430 may be used to input or output data of the electronic system 400. The electronic system 400 may be coupled to an external device, for example, a personal computer or network through the I/O device 430, and exchange data with the external device. The chip 420 may store codes and data for the operation of the processor 410, and process a part of the operation allocated by the processor 410. For example, the chip 420 may include the above-described semiconductor devices (i.e., see FIGS. 3-4, and the related descriptions of FIGS. 3-4). The electronic system 400 may form various electronic control devices requiring the chip 420. For example, the electronic system 400 may be used for a mobile phone, an MP3 player, a navigation system, a solid disk drive (SSD), household appliances and the like.

While various embodiments have been described above, it will be understood to those skilled in the art that the embodiments described are by way of example only. Accordingly, the semiconductor device described herein should not be limited based on the described embodiments.

What is claimed is:

1. A semiconductor device comprising:
   a mat array;
   a plurality of memory cell mats each including bit lines, the memory cell mats included in the mat array;
   edge sense amplifier blocks comprising edge sense amplifiers coupled to half of the bit lines of the outermost memory cell mats among the memory cell mats, wherein the half of the bit lines of the outermost memory cell mats are coupled to the edge sense amplifiers, respectively, and are configured for a first input; and
   half dummy mats each having an area corresponding to half of the area of a memory cell mat of the plurality of memory cell mats and configured to provide reference bit lines for a second input to the edge sense amplifiers, respectively,
   wherein each of the reference bit lines is configured by coupling bit lines within the half dummy mat by two.

2. The semiconductor device of claim 1, wherein the half dummy mats are respectively arranged at edges of the mat array.

3. The semiconductor device of claim 1, wherein the memory cell mats are located between the half dummy mats.

4. The semiconductor device of claim 1, wherein the half dummy mat is separated from the memory cell mats, with the edge sense amplifier block provided between the half dummy mat and the memory cell mat.

5. The semiconductor device of claim 1, wherein a substrate bias voltage is continuously applied to all word lines within the half dummy mats.

6. The semiconductor device of claim 1, wherein the reference bit line has the same capacitance value as the bit lines in the memory cell mat.

7. The semiconductor device of claim 1, wherein the two bit lines forming the reference bit line are arranged adjacent to each other.

8. The semiconductor device of claim 1, wherein each of the bit lines formed in the half dummy mat have a length that is half of the length of the bit lines formed in the memory cell mat.

9. The semiconductor device of claim 1, wherein the number of word lines formed in each of the half dummy mats are half of the number of word lines formed in each of the memory cell mats.

10. The semiconductor device of claim 1, wherein the plurality of memory cell mats and the half dummy mats are arranged in a line along a column direction.

11. The semiconductor device of claim 10, wherein the semiconductor device includes a plurality of mat arrays each comprising the plurality of memory cell mats and the half dummy mats arranged in a line along the column direction, and arranged along a word line direction with a column region interposed between the mat arrays.

12. The semiconductor device of claim 11, further comprising reservoir capacitor blocks arranged in the column regions and located adjacent to sides of the half dummy mats, respectively, and each reservoir capacitor block comprising a reservoir capacitor.

13. The semiconductor device of claim 12, wherein the reservoir capacitor comprises a MOS capacitor.

14. The semiconductor device of claim 11, further comprising sub-word line blocks arranged in the column regions and located adjacent to sides of the memory cell mats, respectively, and each sub-word line block comprising sub word line drivers configured for driving word lines of the memory cell mats.

15. The semiconductor device of claim 11, further comprising sense amplifier blocks arranged in row regions between the respective memory cell mats, and each of the sense amplifier blocks comprising a sense amplifier configured to sense bit line voltages of the memory cell mats.

16. A memory card comprising:
    a memory; and
    a memory controller configured to exchange electrical signals with the memory;
    wherein the memory includes a semiconductor device, comprising:
    a mat array;
    a plurality of memory cell mats each including bit lines, the memory cell mats included in the mat array; edge sense amplifier blocks comprising edge sense amplifiers coupled to half of the bit lines of the outermost memory cell mats among the memory cell mats, wherein the half of the bit lines of the outermost memory cell mats are coupled to the edge sense amplifiers, respectively, and are configured for a first input; and
    half dummy mats each having an area corresponding to half of the area of a memory cell mat of the plurality of memory cell mats and configured to provide reference bit lines for a second input to the edge sense amplifiers, respectively,
    wherein each of the reference bit lines is configured by coupling bit lines within the half dummy mat by two.

17. An electronic system comprising:
    a processor;
    an I/O device configured to exchange data with the external device; and
    a chip configured to store codes and data for the operation of the processor, and process a part of the operation allocated by the processor;
    wherein the processor, the I/O bus and the chip configured to communicate with each other through a bus,
    wherein the chip includes a semiconductor device, comprising:
    a mat array;
    a plurality of memory cell mats each including bit lines, the memory cell mats included in the mat array; edge sense amplifier blocks comprising edge sense amplifiers coupled to half of the bit lines of the outermost memory cell mats among the memory cell mats, wherein the half of the bit lines of the outermost memory cell mats are coupled to the edge sense amplifiers, respectively, and are configured for a first input; and half dummy mats each having an area corresponding to half of the area of a memory cell mat of the plurality of memory cell mats and configured to provide reference bit lines for a second input to the edge sense amplifiers, respectively, wherein each of the reference bit lines is configured by coupling bit lines within the half dummy mat by two.

* * * * *